(12) United States Patent
Wang et al.

(10) Patent No.: US 9,397,630 B2
(45) Date of Patent: Jul. 19, 2016

(54) DIRECTIONAL BASED AUDIO RESPONSE TO AN EXTERNAL ENVIRONMENT EMERGENCY SIGNAL

(71) Applicant: DTS, INC., Calabasas, CA (US)

(72) Inventors: Liang (Vincent) Wang, Singapore (SG); Christopher Yap, Singapore (SG); Shankar Rathoud, Singapore (SG); Cedric Tio, Singapore (SG)

(73) Assignee: DTS, INC., Calabasas, CA (US)

( * ) Notice: Subject to any disclaimer, the term of this patent is extended or adjusted under 35 U.S.C. 154(b) by 540 days.

(21) Appl. No.: 13/858,815

(22) Filed: Apr. 8, 2013

(65) Prior Publication Data

US 2014/0301556 A1    Oct. 9, 2014

Related U.S. Application Data

(60) Provisional application No. 61/621,915, filed on Apr. 9, 2012.

(51) Int. Cl.
*H03G 9/00* (2006.01)
*H03G 9/02* (2006.01)

(52) U.S. Cl.
CPC ............... *H03G 9/00* (2013.01); *H03G 9/005* (2013.01); *H03G 9/025* (2013.01)

(58) Field of Classification Search
CPC .......... H03G 9/00; H03G 9/025; H03G 9/05; G08G 1/0965
USPC .......... 381/57, 98, 101–104, 107, 71.4, 94.2; 340/901–905, 384.4, 692, 693.3, 936, 340/943, 988, 989
See application file for complete search history.

(56) References Cited

U.S. PATENT DOCUMENTS 4,736,432 A * 4/1988 Cantrell .......................... 381/83
5,278,553 A    1/1994 Cornett et al.
(Continued)

FOREIGN PATENT DOCUMENTS

WO    WO 2011030422 A1 *    3/2011

OTHER PUBLICATIONS

PCT Application No. PCT/US2013/035829, International Preliminary Report on Patentability, in corresponding U.S. Appl. No. 13/858,815.
(Continued)

*Primary Examiner* — David Ton
(74) *Attorney, Agent, or Firm* — Blake Welcher; William Johnson; Craig Fischer

(57) ABSTRACT

An audio signal attenuation system and method for detecting an audio emergency warning signal (or alarm) in a vehicle in which an audio signal is being played. Embodiments of the system and method make it easier for a police, fire, or other emergency alarm or siren to be heard in a loud or noisy listening environment when audio signal is being reproduced. This is achieved using selective frequency attenuation, which identifies a frequency of the alarm and then selectively attenuates the alarm frequency in the audio signal. Moreover, direction data that includes information about from which direction the alarm is coming can be used to selectively attenuate the alarm frequency in certain channels (or speakers) of the audio signal. In some embodiments, audio cues are used to alert the listener to the alarm signal and are adjusted based on alarm distance from the vehicle, speed, and the type of alarm.

15 Claims, 7 Drawing Sheets

(56) References Cited

U.S. PATENT DOCUMENTS

| | | | |
|---|---|---|---|
| 5,757,284 A | 5/1998 | Trizzino | |
| 6,087,961 A * | 7/2000 | Markow | 340/902 |
| 6,362,749 B1 | 3/2002 | Brill | |
| 6,778,073 B2 | 8/2004 | Lutter et al. | |
| 6,788,101 B1 | 9/2004 | Rahman | |
| 6,876,298 B2 | 4/2005 | Litkouhi et al. | |
| 7,102,536 B2 | 9/2006 | Scholz | |
| 7,274,288 B2 | 9/2007 | Nagata | |
| 7,649,444 B1 | 1/2010 | Fear et al. | |
| 7,791,499 B2 | 9/2010 | Mohan et al. | |
| 7,916,039 B2 | 3/2011 | Hess et al. | |
| 7,969,821 B2 | 6/2011 | Yonak et al. | |
| 8,138,946 B2 * | 3/2012 | Villalobos et al. | 340/902 |
| 8,212,659 B2 | 7/2012 | Iwamoto | |
| 8,319,620 B2 | 11/2012 | Usher et al. | |
| 2002/0150262 A1 | 10/2002 | Carter | |
| 2003/0108212 A1 | 6/2003 | Yun | |
| 2003/0141967 A1 | 7/2003 | Aichi et al. | |
| 2005/0074131 A1 | 4/2005 | McCall et al. | |
| 2006/0083388 A1 | 4/2006 | Rothschild | |
| 2009/0146799 A1 * | 6/2009 | Goldstein et al. | 340/463 |
| 2009/0179774 A1 | 7/2009 | Mohan et al. | |
| 2009/0322559 A1 | 12/2009 | Yen et al. | |
| 2010/0020978 A1 * | 1/2010 | Garudadri et al. | 381/57 |
| 2012/0194353 A1 | 8/2012 | Groves | |
| 2012/0230504 A1 * | 9/2012 | Kuroda | 381/71.4 |
| 2014/0044269 A1 * | 2/2014 | Anderson | 381/57 |
| 2014/0185828 A1 * | 7/2014 | Helbling | 381/103 |

OTHER PUBLICATIONS

International Search Report and Written Opinion, in corresponding PCT Application No. PCT/US2013/035829.

\* cited by examiner

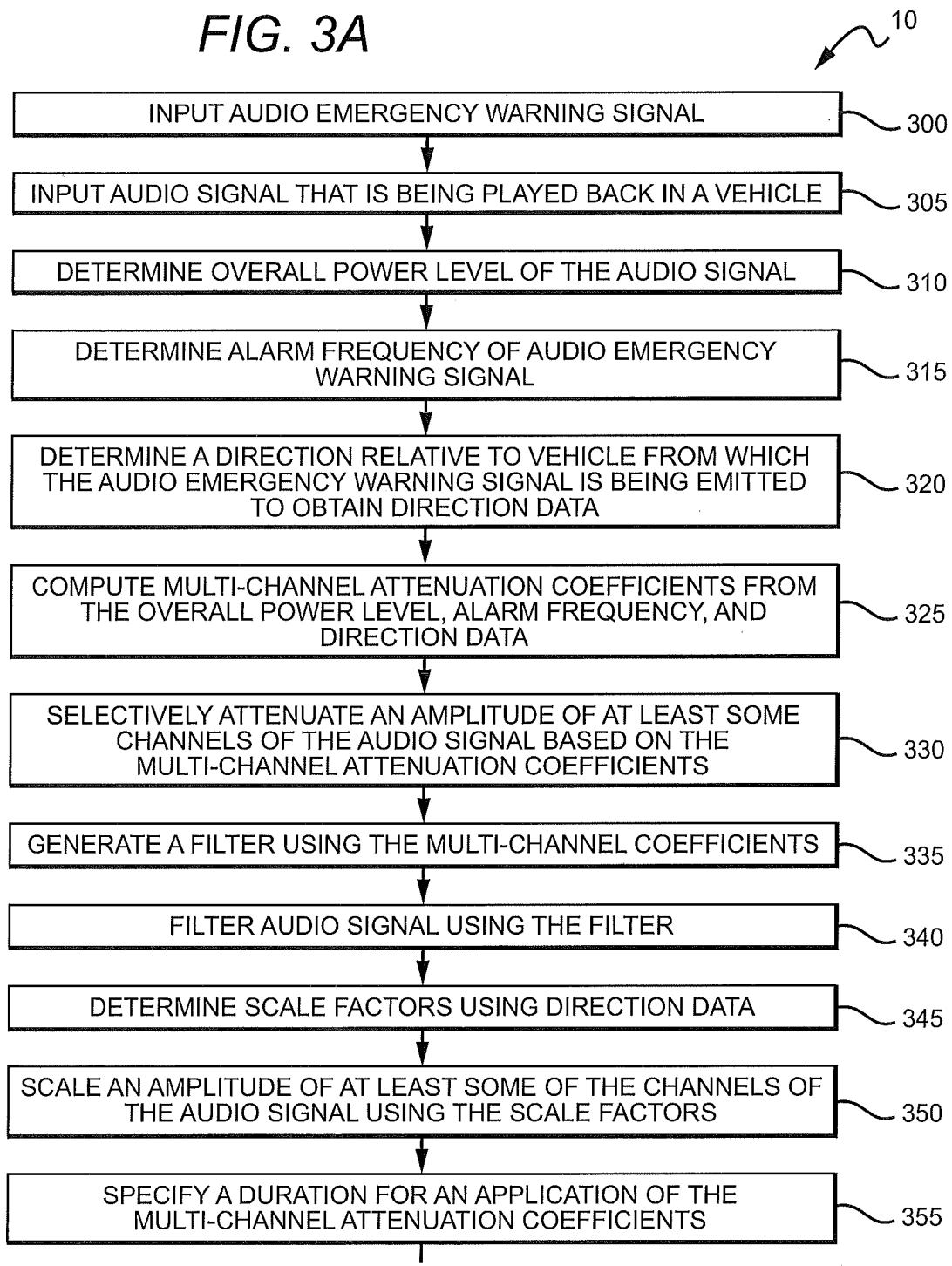

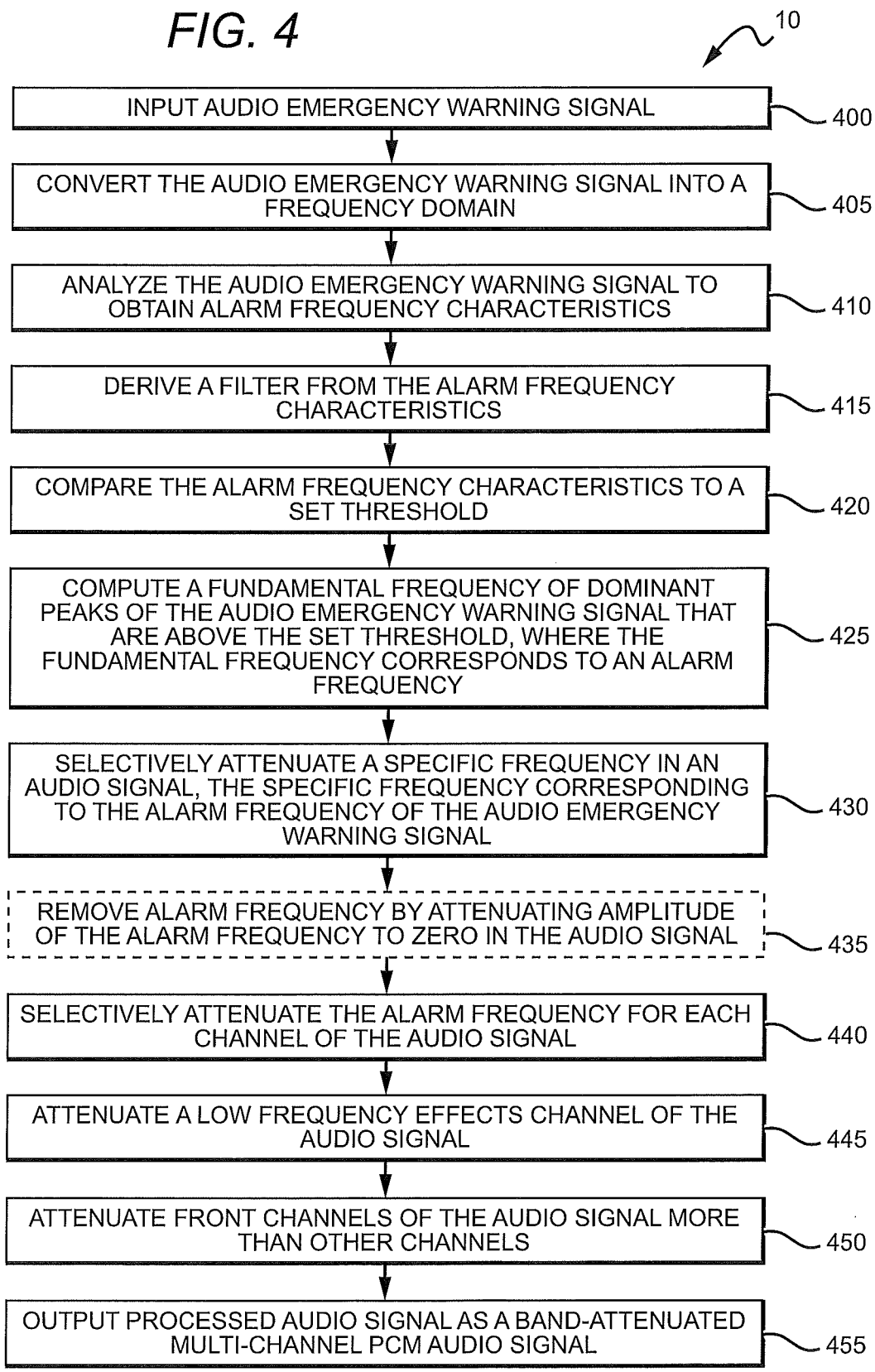

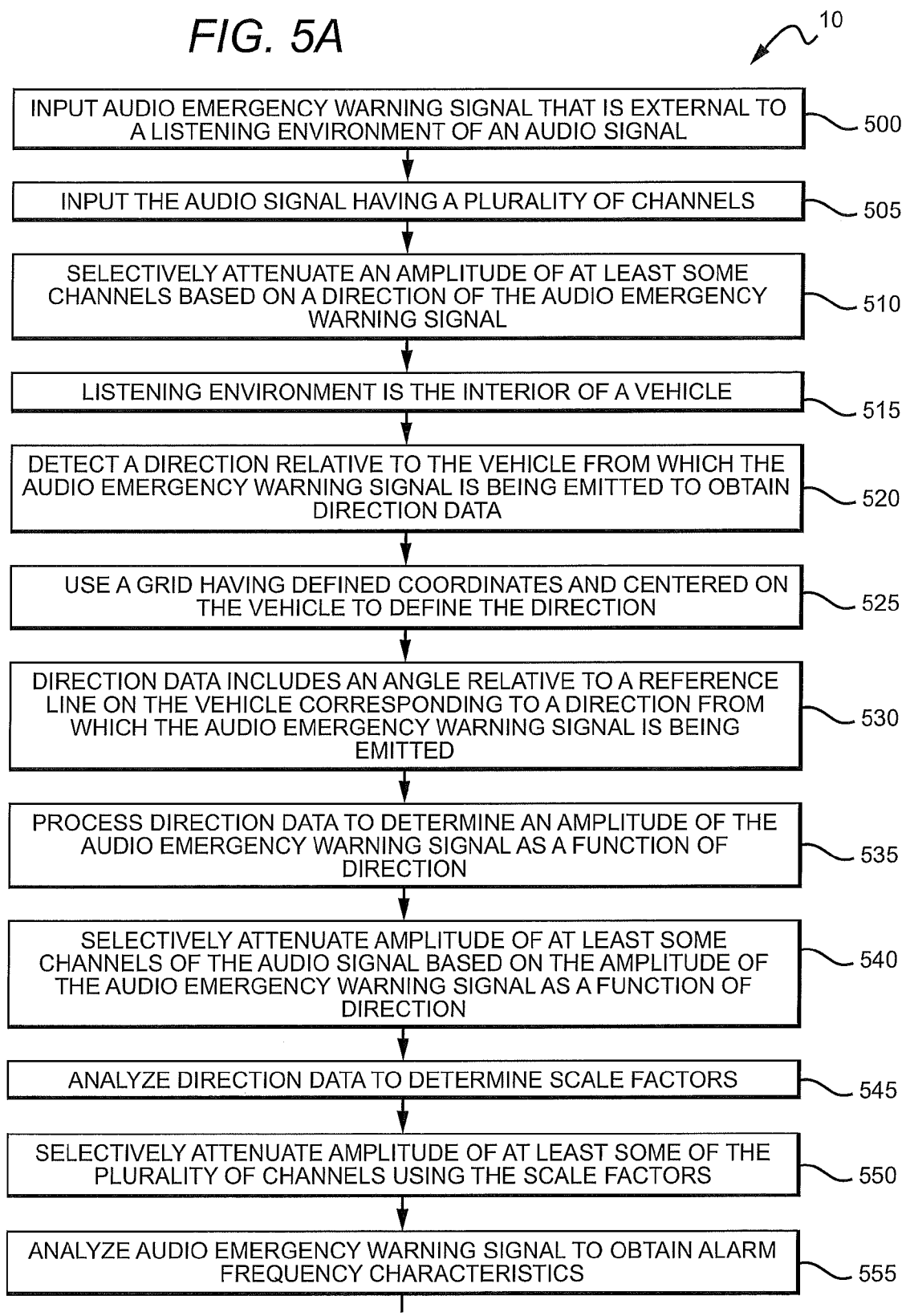

DIRECTIONAL BASED AUDIO RESPONSE TO AN EXTERNAL ENVIRONMENT EMERGENCY SIGNAL

RELATED APPLICATION

This application is a non-provisional of U.S. Provisional No. 61/621,915, filed Apr. 9, 2012, the disclosure of which is hereby incorporated by reference in its entirety.

BACKGROUND

The demand for improved audio and video entertainment has moved beyond the home and is now prevalent in the automotive space. New entertainment systems are one of the hottest trends in the automotive marketplace. Automotive entertainment systems have become as sophisticated as home theater systems. Consequently, automobile occupants have access to rich sounding audio and Internet-based applications through complex entertainment systems. Moreover, engineering and material improvements make the automobile cabin fairly insulated from external sounds such as road noise.

Sophisticated audio systems of the automotive entertainment systems provide high-quality audio that can be enjoyed occupants in the relatively quiet environment of the automobile cabin. However, these same enhancements to audio enjoyment in an automobile also prevent a driver from hearing noises external to the car. While some of these noises may be insignificant environment noise, others may include important emergency signals that a driver should be able to detect and respond accordingly. Thus, drivers are becoming increasingly unable when driving to readily detect and adapt to external warning signals—such as fire, police, or medical sirens and alarms.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In general, embodiments of the audio signal attenuation system and method are used to process an audio signal in response to an external alarm (also called an audio emergency warning signal). This audio emergency warning signal may be a siren being emitted from an emergency vehicle, such as a fire, medical, or police siren. Embodiments of the system and method make it easier for the audio emergency warning signal to be detected in a loud or noisy listening environment where the audio signal is being reproduced. In some embodiments the listening environment is a mobile listening environment, such as the interior of a vehicle (such as an automobile). For example, in some embodiments the listening environment may be an automobile and the audio signal may be music playing from a stereo system in the automobile. The system and method may it possible for a listener in the automobile to hear an alarm signal that is outside of the automobile, even when the music is playing loud and the windows are up.

In some embodiments of the system and method, the audio emergency warning signal is detected and its frequency characteristics are determined. In particular, an alarm frequency of the alarm is determined and that particular frequency is filtered from the audio signal. This filtering may include complete removal from the audio signal or may be a distinct attenuation of the audio signal such that the alarm signal can be heard by the listener. There is a distinct advantage is performed selective frequency attenuation instead of channel volume attenuation. In order to achieve the same results (and allow the alarm to be heard) the volume of the audio signal would have to be turned down drastically. Thus, selective frequency attenuation is an improved option compared to channel volume attenuation.

In some embodiments, the system and method determine direction data that includes information about from which direction the alarm is coming. This direction data can be used to selectively attenuate certain channels (or speakers) of the audio signal. For example, if the alarm signal is coming from the left rear of the automobile, then the system and method can attenuate the alarm frequency in those left rear speakers to allow the alarm signal to be detected. In some embodiments the channels of the audio signal may be attenuated through a proportional ratio based do the direction from where the siren or alarm signal is coming. Moreover, the direction can be defined using a grid having defined coordinates and centered on the vehicle. In addition, the direction data can include an angle relative to a reference line on the vehicle corresponding to a direction from which the audio emergency warning signal is being emitted.

Some embodiments of the system and method generate multi-channel attenuation coefficients and use these coefficients to selectively attenuate amplitude of at least some channels of the audio signal. These multi-channel attenuation coefficients are obtained from an overall power level of the audio signal, an alarm frequency of the alarm signal, and the direction data. In addition, a filter can be generated using the coefficients and then used to selectively attenuate at least some channels in the audio signal. Moreover scale factors can be determined using the direction data and used to scale the amplitude. The amplitude of at least some of the plurality of channels also can be scaled based on the overall power level and the scale factors. In other embodiments, the system and method avoid attenuating any of the plurality of channels that contain a vocal track in order to maintain the integrity of music contained in the audio signal.

In some embodiments of the system and method duration is specified during which the multi-channel coefficients are applied to the audio signal. Once the duration has elapsed or the alarm signal ceases the amplitude is returned to prior levels. Moreover, the alarm signal may be captured by one or more microphone external to the vehicle for reproduction with the audio signal. In other words, the alarm signal can be played through the plurality of channels (or speakers) to alert the listener to the alarm signal. In other embodiments, one or more audio cues (or earcons) are played for the listener in order to alert the listener to the alarm signal.

The rate of occurrence of the audio cue as well as it amplitude can be based on one or more of a distance of the alarm from the vehicle, the speed at which the alarm is moving toward the vehicle, and the type of alarm (such as a fire, police, or ambulance siren). Specifically, in some embodiments the system and method estimate a distance between the source of the audio emergency warning signal and the vehicle and a rate of occurrence and amplitude of the playing of audio cues is based on the distance. In other embodiments the system and method estimate a speed between the source of the audio emergency warning signal and the vehicle and a rate of occurrence and amplitude of the playing of audio cues is based on the speed. In still other embodiments the system and method estimate a type of alarm based on the alarm frequency of the audio emergency warning signal. The rate of occurrence and amplitude of the playing of audio cues is based on the type of alarm.

It should be noted that alternative embodiments are possible, and steps and elements discussed herein may be changed, added, or eliminated, depending on the particular embodiment. These alternative embodiments include alternative steps and alternative elements that may be used, and structural changes that may be made, without departing from the scope of the invention.

DRAWINGS DESCRIPTION

Referring now to the drawings in which like reference numbers represent corresponding parts throughout:

FIGS. 3A and 3B are a flowchart diagram illustrating an overview of the operation of the audio signal attenuation system shown in FIGS. 1 and 2.

FIG. 4 is a flowchart diagram illustrating the detailed operation of selective frequency attenuation in the audio signal attenuation system shown in FIGS. 1-3.

FIGS. 5A and 5B are a flowchart diagram illustrating the detailed operation of using direction data to selectively attenuate channels as used in the audio signal attenuation system shown in FIGS. 1-3.

DETAILED DESCRIPTION

Figure 1:
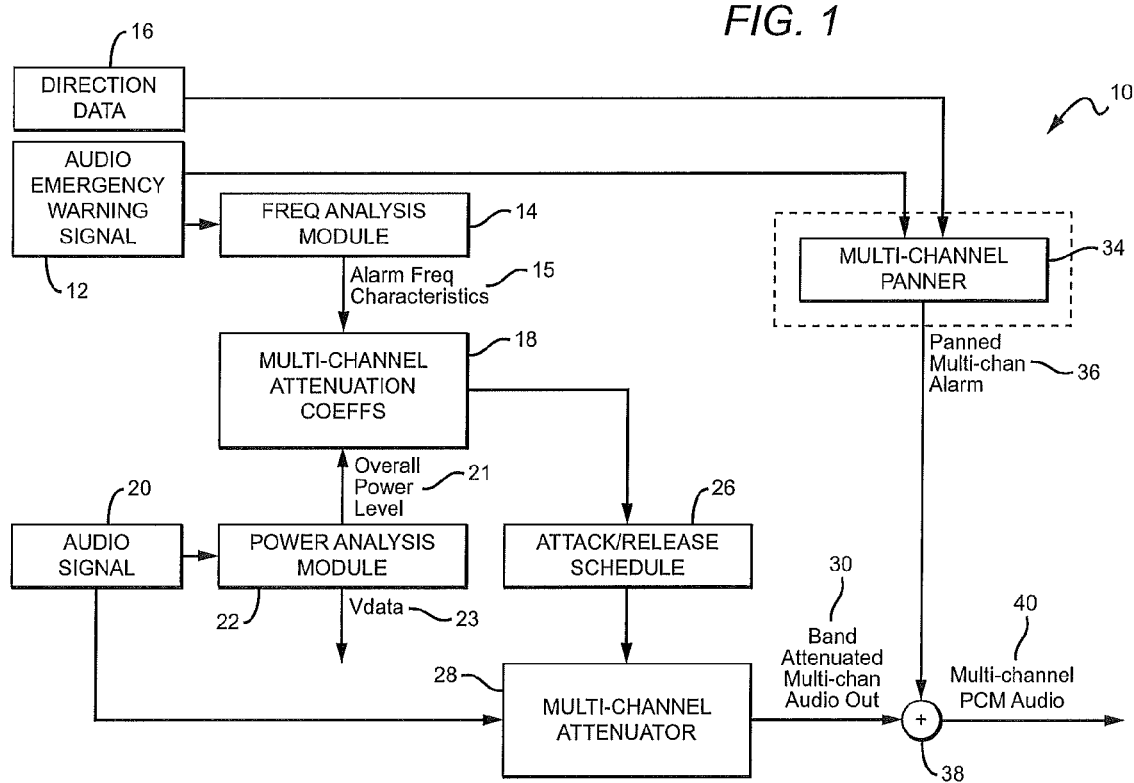
FIG. 1 is block diagram of an exemplary embodiment of the audio signal attenuation system and method described herein.

In the following description of an audio signal attenuation system and method reference is made to the accompanying drawings, which form a part thereof, and in which is shown by way of illustration a specific example whereby embodiments of the audio signal attenuation system and method may be practiced. It is to be understood that other embodiments may be utilized and structural changes may be made without departing from the scope of the claimed subject matter.

Moreover, in the following description numerous specific details are set forth. However, it is understood that embodiments of the audio signal attenuation system and method may be practiced without these specific details. In other instances, well-known circuits, structures, and techniques have not been shown in order not to obscure the understanding of this description.

Embodiment of the audio signal attenuation system and method may be implemented by hardware, firmware, software or any combination thereof. When implemented in software, embodiments of the audio signal attenuation system and method are essentially the code segments to perform the necessary tasks. The software may include the actual code to carry out the operations described in some embodiments, or code that emulates or simulates the operations.

The program or code segments can be stored in a processor or machine accessible medium or transmitted by a computer data signal embodied in a carrier wave, or a signal modulated by a carrier, over a transmission medium. The "processor readable or accessible medium" or "machine readable or accessible medium" may include any medium that can store, transmit, or transfer information. Examples of the processor readable medium include an electronic circuit, a semiconductor memory device, a read only memory (ROM), a flash memory, an erasable ROM (EROM), a floppy diskette, a compact disk (CD) ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, and so forth.

The machine accessible medium may be embodied in an article of manufacture. The machine accessible medium may include data that, when accessed by a machine, cause the machine to perform the operation described herein. The term "data" here refers to any type of information that is encoded for machine-readable purposes. Therefore, it may include program, code, data, file, and so forth.

Each or some embodiments of the audio signal attenuation system and method may be implemented by software. The software may have several modules coupled to each another. A software module is coupled to another module to receive variables, parameters, arguments, pointers, etc. and/or to generate or pass results, updated variables, pointers, and so forth. A software module may also be a software driver or interface to interact with the operating system running on the platform. A software module may also be a hardware driver to configure, set up, initialize, send and receive data to and from a hardware device.

Some embodiments of the audio signal attenuation system and method may be described as a process which is may be depicted as a flowchart, a flow diagram, a structure diagram, or a block diagram. Although a block diagram may describe the operations as a sequential process, many of the operations can be performed in parallel or concurrently. In addition, the order of the operations may be re-arranged. A process is terminated when its operations are completed. A process may correspond to a method, a program, a procedure, and so forth.

It should be noted that embodiments of the audio signal attenuation system and method may be implemented in hardware, firmware, or software, or any combination thereof. Moreover, various processing components described below may be software components or modules associated with a processor (such as a central processing unit). In addition, audio "signals" and "sub-signals" represent a tangible physical phenomenon, specifically, a sound, that has been converted into an electronic signal and suitably pre-processed.

All or some embodiments of the audio signal attenuation system and method may be employed in a conventional vehicle. A conventional vehicle includes a standard audio system having at least two channels which are reproduced through speakers. However, embodiments of the audio signal attenuation system and method may be implemented on any vehicle having any number of speakers and channels.

I. Audio Signal Attenuation System

FIG. 1 is block diagram of an exemplary embodiment of the audio signal attenuation system and method described herein. Referring to FIG. 1, the audio signal attenuation system 10 is illustrated. The system 10 receives an audio emergency warning signal 12, which may be any audible emergency warning signal. By way of example, this audio emergency warning signal 12 may be a siren from an emergency response vehicle. The audio emergency warning signal 12 is received by the system 10 through sensors such as microphones or microphone arrays (not shown).

Once the audio emergency warning signal 12 is received by the system 10 it is converted into the frequency domain. Conventional methods to convert a signal into the frequency domain may be employed, such as a Fast Fourier Transform or a Modified Discrete Cosine Transform. Once converted into the frequency domain, a frequency analysis module 14 performs a frequency analysis on the audio emergency warning signal 12 to generate alarm frequency characteristics 15.

The alarm frequency characteristics 15 are used to derive a filter (not shown) for filtering an alarm frequency from an audio signal 20. It should be noted that the audio signal 20 is typically playing inside a vehicle, such as an automobile. The alarm frequency is the dominant or fundamental frequency of the audio emergency warning signal 12. Masking techniques are used to filter or remove the alarm frequency from the audio signal 20. The alarm frequency is obtained by analyzing the audio emergency warning signal 12 in the frequency domain and comparing it against a set threshold. Subsequently, the fundamental frequency, $F_O$, of the dominant peaks is computed. Finally, the filter is designed based on this analysis.

As shown in FIG. 1, a direction data 16 represents data that indicates a direction from where the audio emergency warning signal 12 is being emitted. The direction data 16 may be detected by at least one sensor strategically placed around the body of the vehicle. The vehicle may be represented as a grid having defined coordinates, whereby the strategic placement of the sensors captures the directional angle from where the audio emergency warning signal 12 is being detected in relation to the vehicle. By way of example, if the audio emergency warning signal 12 is being received by sensors on the right side of the vehicle, the direction data 16 includes data illustrating that the source of the audio emergency warning signal 12 is being emitted (or emanates) from the right side of the vehicle.

In some embodiments, multi-channel attenuation coefficients 18 are generated using the alarm frequency characteristics 15 (or the alarm frequency), an overall power level 21 (or amplitude) of the audio signal 20, and the direction data 16. In some embodiments the direction data 16 is analyzed to determine scale factors (not shown) for scaling the amplitude of the audio signal 20 based on the direction from where the audio emergency warning signal 12 is being detected. In some embodiments the audio signal 20 is played back in a listening environment that is the interior of a vehicle (such as an automobile). In some embodiments include detecting a direction relative to the vehicle from where the audio emergency warning signal 12 is being emitted to generate the direction data 16. Moreover, in some embodiments the direction data 16 includes an angle relative to a reference line on the vehicle corresponding to a direction from where the audio emergency warning signal 12 is being emitted.

Embodiments of the audio signal attenuation system 10 and method include a power analysis module 22 that analyzes the overall power lever (loudness or amplitude) of the audio signal 20. This analysis may occur through strategic placement of sensors within the body of the vehicle. Alternatively, the overall power level information may be passed from an internal audio system to embodiments of the audio signal attenuation module 10. In alternate embodiments, visual data (Vdata) 23 from the power analysis module 22 may be used to visually display the overall power level of the audio signal 20.

In some embodiments the audio signal 20 contains a plurality of channels. Typically, each channel is played back through a speaker in the vehicle. The multi-channel attenuation coefficients 18 may also be used to determine filters for filtering the audio signal 20 based on the alarm frequency and scale factors for scaling the amplitude of the audio signal 20 are determined using the direction data 16. From the multi-channel attenuation coefficients 18, the alarm frequency of the audio emergency warning signal 12 is filtered from the audio signal 20 in some or all of the channels proportionately, based on the direction data 16.

In some embodiments the direction data 16 is used to identify the channel (or speaker) having the greatest impact. The direction data 16 is analyzed to determine scale factors for scaling the amplitude of at least some of the plurality of channels based on the direction from where the audio emergency warning signal 12 is being detected. Thus, the audio signal 20 is filter to attenuate or completely remove the alarm frequencies. In other words, the audio signal 20 is scaled to lower the amplitude of the audio signal in at least some of the channels. This selectively mutes the audio signal 20 so that the audio emergency warning signal 12 can be detected (such as by a listener in the vehicle listening to the audio signal).

Each channel (or speaker) may be scaled according to a ratio, or be proportionately attenuation based on the direction of the audio emergency warning signal 12 such that the channels having the greatest impact are attenuated to a greater degree than other channels. For example, if the audio emergency warning signal 12 is being detected from the right side of the vehicle, the amplitude of the front right and rear right speakers may be scaled to a greater degree than the front left and rear left speakers. In some embodiments, channels in the audio signal 20 that contain vocal tracks may not be filtered or may be minimally filtered in order to maintain the integrity of the music in the audio signal 20. In other embodiments, the amplitude of all channels may be scaled.

Once the multi-channel attenuation coefficients 18 and scale factors are determined, an attack/release (or duration) schedule 26 for their application is determined. Specifically the duration for the application of the multi-channel attenuation coefficients is determined such that the filtered and scaled audio signal 20 is returned to normal levels once the audio emergency warning signal 12 has ceased or gets far enough away from the vehicle. A multi-channel attenuator 28 is used to apply the multi-channel attenuation coefficients and scale factors to the audio signal 20. The band (or channel) attenuated multi-channel audio output 30 is output from the multi-channel attenuator 28.

In some embodiments, the audio emergency warning signal 12 may be synthesized or passed through for playback over the speakers in the vehicle. In this embodiment, a multi-channel panner 34 is used to allow the audio emergency warning signal 12 to be reproduced through the internal audio speakers (or channels) according to the direction data 16. The output from the multi-channel panner 34 is a panned multi-channel emergency warning signal (or alarm) 36. The band-attenuated multi-channel audio output 30 is added to the panned multi-channel emergency warning signal 36 using an adder 38 to produce an output of multi-channel pulse-code modulation (PCM) audio 40.

Figure 2:
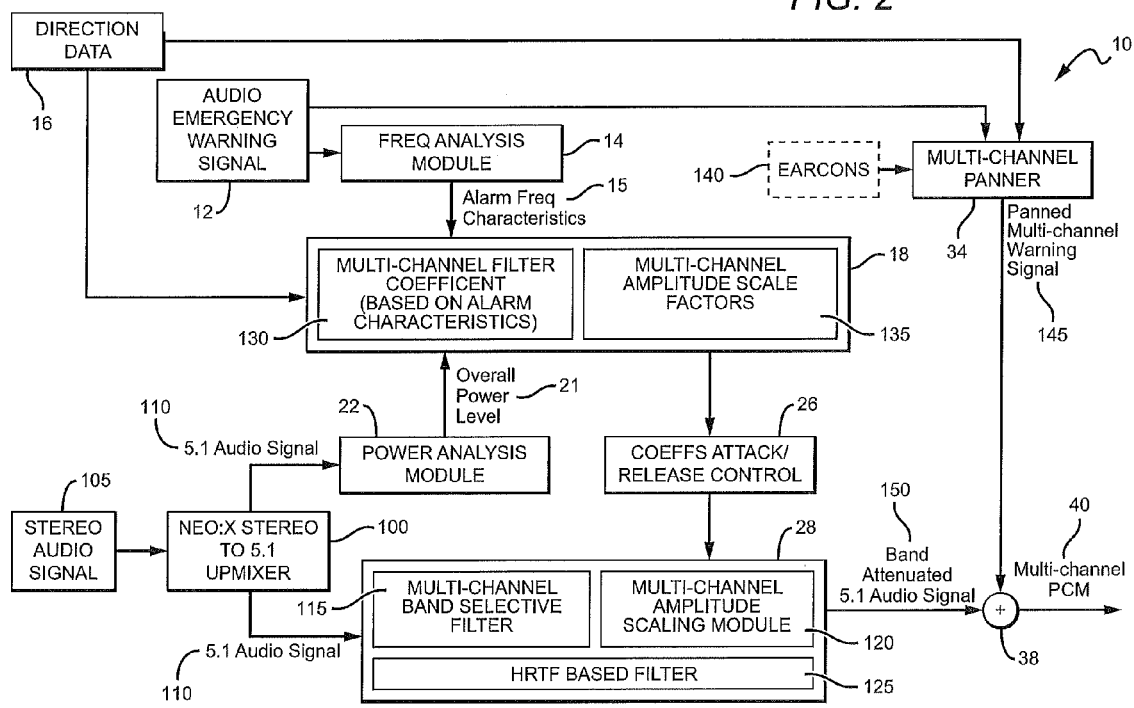
FIG. 2 is a detailed block diagram illustrating a specific embodiment of the audio signal attenuation system and method shown in FIG. 1.

FIG. 2 is a detailed block diagram illustrating a specific embodiment of the audio signal attenuation system and method shown in FIG. 1. In particular, FIG. 2 illustrates the audio signal attenuation system 10 and method having an upmixer 100 to allow a stereo audio signal 105 input to be upmixed into a 5.1 audio signal 110. It should be noted that although in this example the stereo audio signal 105 is upmixed to the 5.1 audio signal 110, in other embodiments the upmix may be a mono to stereo audio signal or a 5.1 to 7.1 audio signal. Moreover, in the embodiments shown in FIG. 2, the upmixer 100 uses the Neo:X™ technology to create the 5.1 audio signal 110. The Neo:X™ technology is made by DTS®, Inc. of Calabasas, Calif.

The audio attenuation system 10 and method also include the multi-channel attenuator 28 that is used to apply the multi-channel attenuation coefficients and scale factors to the 5.1 audio signal 110. The multi-channel attenuator 28 includes a multi-channel band selective filter 115 that selectively filters a frequency or frequencies from the 5.1 audio signal 110. Moreover, the multi-channel attenuator 28 includes a multi-channel amplitude scaling module 120 that scales the various channels of the 5.1 audio signal 110 based on the scale factors and direction data 16. The multi-channel attenuator 28 also includes a head-related transfer function (HTRF) based filter 125 for tuning the 5.1 audio signal to a listener's head and the listening environment. In some embodiments the listening environment is within a vehicle, such as an automobile.

The audio emergency warning signal 12 is input to the frequency analysis module 14 that processes the signal 12 and outputs alarm frequency characteristics 15. Moreover, the 5.1 audio signal 110 is processed by the power analysis module 22 to obtain the overall power level 21 of the 5.1 audio signal 110. The multi-channel attenuation coefficients 18 are generated using the overall power level 21, the direction data 16, and the alarm frequency characteristics 15. The multi-channel attenuation coefficients 18 includes multi-channel filter coefficients 130, which are by the multi-channel band selective filter 115 to filter certain frequencies (such as the frequency of the audio emergency warning signal 12) out of the 5.1 audio signal 110. Moreover, the multi-channel attenuation coefficients 18 include multi-channel amplitude scale factors (or scale factors) 135, which are used by the multi-channel amplitude scaling module 120 to scale at some of a plurality of channels of the 5.1 audio signal 110 based on the direction of the audio emergency warning signal 12 and the overall power level 21 of the 5.1 audio signal 12.

In the embodiments shown in FIG. 2, the audio signal attenuation system 10 and method includes the multi-channel panner 34 that is used to reproduce or synthesize the audio emergency warning signal 12 through the internal audio speakers (or channels). In some embodiments the multi-channel panner 34 uses the direction data 16 to determine how the audio emergency warning signal 12 should be played back through the audio speakers and which speaker should be used.

In some embodiments an earcon 140 is also used by the multi-channel panner 34 to introduce audio cues into the listening environment. The earcon 140 can be a single one or a series of brief, distinctive sounds that are used to convey information to a listener in the listening environment. In some embodiments the earcon 140 may be used in conjunction with the playing of the audio emergency warning signal 12, while in alternative embodiments the earcon 140 may be used alone.

In some embodiments the rate of occurrence (or how often the audio cue is played) and the amplitude of the playing of audio cues is based on the distance between the source of the audio emergency warning signal 12 and the vehicle containing the listening environment. In other embodiments the rate of occurrence and amplitude of the audio cues is based on a speed between the source of the audio emergency warning signal 12 and the vehicle. In still other embodiments the rate of occurrence and amplitude of the audio cues is based on the type of alarm, which may be determined by the frequency and other attributes of the audio emergency warning signal 12.

The output from the multi-channel panner 34 is a panned multi-channel warning signal 145. A band-attenuated 5.1 audio signal 150 is output from the multi-channel attenuator 28. The panned multi-channel warning signal 145 and the band-attenuated 5.1 audio signal 150 are added to each other using the adder 38 to produce an output of the multi-channel pulse-code modulation (PCM) audio 40.

II. Operational Overview

Figure 3B:
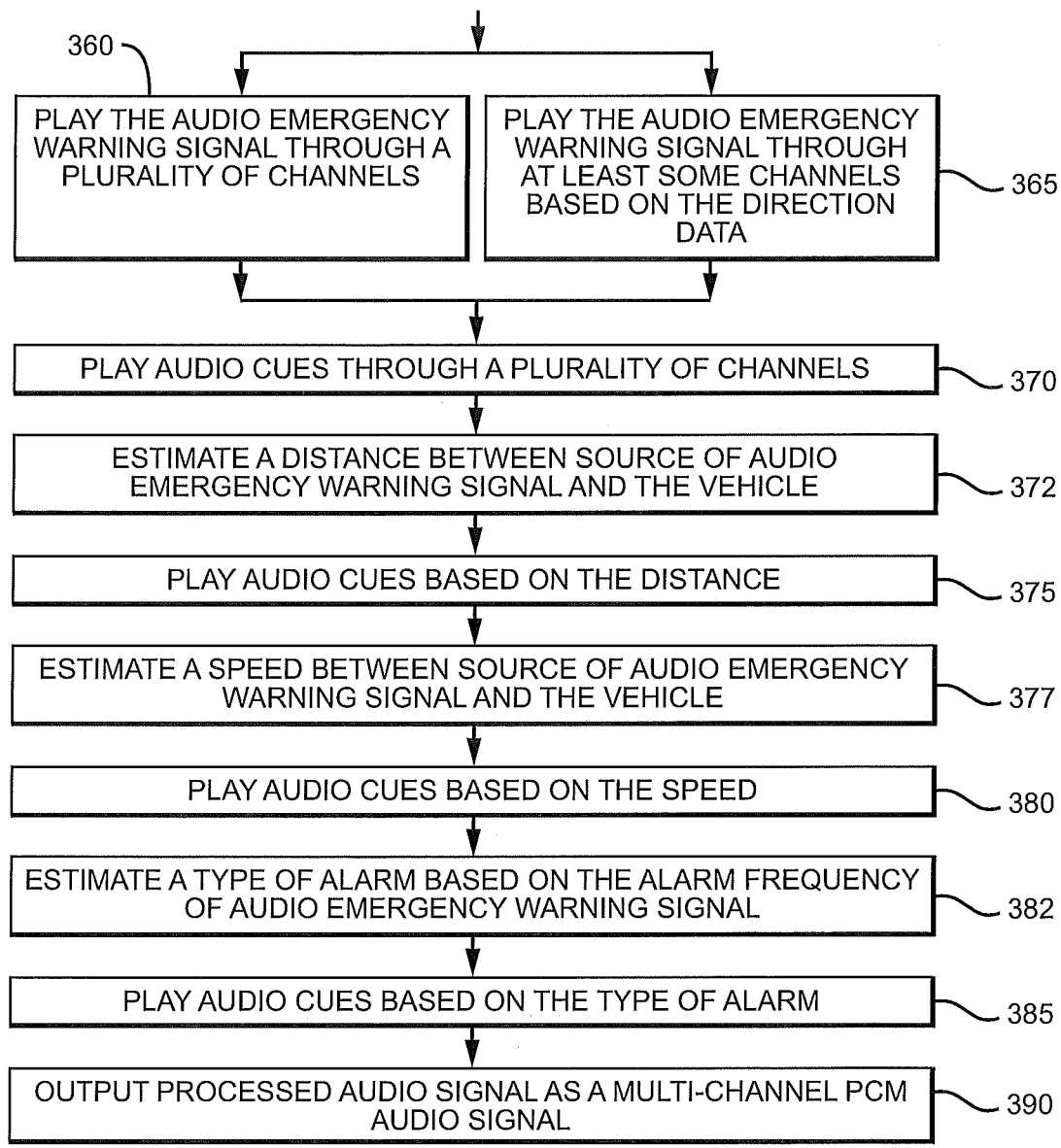

FIGS. 3A and 3B are a flowchart diagram illustrating an overview of the operation of the audio signal attenuation system 10 shown in FIGS. 1 and 2. In should be noted that although the following flowcharts may illustrate an operation or occurring in a serial manner, in some embodiments it is possible that the operation occurs in a parallel manner. The operation begins by receiving as input an audio emergency warning signal 12 (box 300). This audio emergency warning signal 12 may be a siren or alarm from an emergency vehicle, such as an ambulance or police car. The input into the system 10 is typically achieved by using at least one microphone situated around a vehicle in which the audio signal 10 is playing. Embodiments of the system 10 also receive as input an audio signal 20 that is being played back in the vehicle (box 305).

Embodiments of the system 10 determine an overall power level 21 of the audio signal 20 (box 310). The audio emergency warning signal 12 is converted in to the frequency domain and an alarm frequency of the signal 12 is determined by the system 10 (box 315). Embodiments of the system 10 also determine direction data 16 by analyzing the alarm frequency and amplitudes from a microphone array (box 320). This direction data 16 determines a direction relative to the vehicle from which the audio emergency warning signal 12 is being emitted (such as an ambulance).

Embodiments of the system 10 compute multi-channel attenuation coefficients 18 from the overall power level 21, the direction data 16, and the alarm frequency (box 325). These coefficients 18 are used to selectively attenuate an amplitude of at least some channels of the audio signal 20 (box 330). Moreover, the coefficients 18 are used to generate a filter (box 335), and the filter is used to filter the audio signal 20 and attenuate the alarm frequency in the audio signal 20 (box 340).

Embodiments of the system 10 also determine scale factors 135 using the direction data 16 (box 345). These scale factors 135 are used to scale an amplitude of at least some of the channels in the audio signal 20 (box 350). Moreover, some embodiments of the system 10 specify a duration for an application of the multi-channel attenuation coefficients 18 to the audio signal 20 such that the amplitude is returned to previous levels (or the volume of the audio signal 20 immediately prior to the detection of the audio emergency warning signal 12) once the audio emergency warning signal 12 ceases (box 355).

In some embodiments, the system 10 plays the audio emergency warning signal 12 through the speakers in the vehicle. In some embodiments, this playback is achieved by playing the audio emergency warning signal 12 through each of the plurality of channels (or speakers) (box 360). In other embodiments, this playback occurs only through a portion of the available channels based on the direction data (box 365). For example, the direction data may indicate that the audio emergency warning signal 12 is coming from the right side of the vehicle. In this case the playback of the signal 12 would be played back primarily through the speakers on the right side of the vehicle.

Some embodiments of the system 10 use earcons 140 (or audio cues) played back through the speakers to alert a listener of the audio emergency warning signal 12. The audio cues are typically played through each of the plurality of channels (box 370). In some embodiments, the system 10 estimates a distance between the source of the audio emergency warning signal 12 and the vehicle that is playing the audio signal 20 (box 372). Based on this distance, the rate of occurrence (or how many times per minute the audio cues are played) and the amplitude of the audio cues are determined (box 375). In other embodiments the system 10 estimates a speed between the source of the audio emergency warning signal 12 and the vehicle (box 377). This gives an estimate of how fast the audio emergency warning signal 12 is approaching the vehicle that is playing back the audio signal 20. The rate of occurrence and amplitude of the audio cue is based on the speed (box 380). In some embodiments the system 10 estimate the type of alarm based on the frequency or frequencies of the audio emergency warning signal 12 (box 382), and the audio cues are played based on the type of alarm (box 385). For example, if the system 10 detects from the frequency that the alarm is from a police car, the audio cue may alert the listener in a manner that sounds different from an audio cue when the alarm is from an ambulance. The processed audio signal is output from embodiments of the system 10 as a multi-channel pulse-code modulation (PCM) audio signal (box 390).

III. Operational Details

FIG. 4 is a flowchart diagram illustrating the detailed operation of selective frequency attenuation as used in the audio signal attenuation system 10 shown in FIGS. 1-3. The operation begins by receiving as input the audio emergency warning signal 12 (box 400). Next, the audio emergency warning signal 12 is converted into the frequency domain (box 405). Embodiments of the system 10 then analyze the signal 12 in the frequency domain to obtain alarm frequency characteristics 18 (box 410). A filter 130 is then derived using the alarm frequency characteristics 18 (box 415). The filter 130 can be used to filter the alarm frequency from the audio signal 20 and selectively attenuate the alarm frequency in the audio signal 20.

Embodiments of the system 10 compare the alarm frequency characteristics 18 to a set threshold (box 420). Dominant peaks are defined as those parts of the audio signal 20 that are above the set threshold. Embodiments of the system 10 then compute a fundamental frequency of the dominant peaks, where the fundamental frequency is also known as the alarm frequency, or the frequency of the audio emergency warning signal 12 (box 425).

Embodiments of the system 10 selectively attenuate a specific frequency in the audio signal 20 such that an amplitude of the specific frequency is attenuated relative to other frequencies in the audio signal 20 (box 430). In some embodiments the specific frequency corresponds to the alarm frequency of the audio emergency warning signal 12. In other words, the frequency (or at least the dominant or fundamental frequency) of an alarm is attenuated markedly as compared to the other frequencies in the audio signal 20. In some embodiments, the system 10 attenuates the alarm frequency to zero such that the alarm frequency is completely removed from the audio signal 20 (box 435). Note that this is an optional step as indicated by the dashed line.

Some embodiments of the system 10 selectively attenuate the alarm frequency for each channel of a multi-channel audio signal 20 (box 440). It is much more effective to attenuated all channels to allow the listener to effective hear the audio emergency warning signal 12 outside of the vehicle. In other embodiments a low-frequency effects (LFE) channel of the audio signal 20 is attenuated along with any other channels (box 445). Attenuating the LFE channel be even a few decibels serves to improve detection of the audio emergency warning signal 12. This is because it is easier for the mind to focus on the signal 12 when the LFE channel is attenuated. This is especially true because the level of the LFE channel is often quite high in automobiles.

In some embodiments the system 10 attenuates the front channels of the audio signal 10 more than the other channels (box 450). This makes it easier for the listener to hear the audio emergency warning signal 12 because the listener perceives the front channels as stronger than the other channels. Embodiments of the system 10 output the processed audio signal as a band-attenuated multi-channel PCM audio signal (box 455).

Figure 5B:
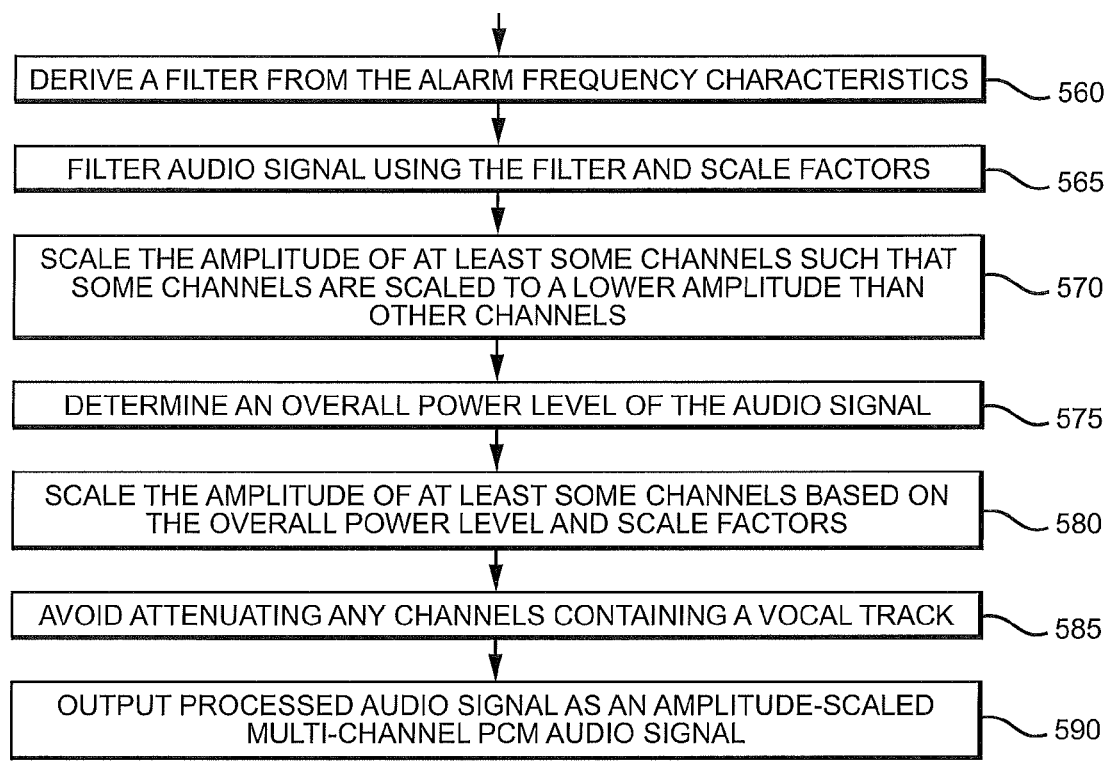

FIGS. 5A and 5B are a flowchart diagram illustrating the detailed operation of using the direction data 16 to selectively attenuate channels as used in embodiments of the audio signal attenuation system 10 shown in FIGS. 1-3. The operation begins by receiving an input the audio emergency warning signal 12, where the signal 12 is external to a listening environment of an audio signal 20 (box 500). In addition, the system 10 receives as input the audio signal 20 having a plurality of channels (box 505).

Embodiments of the system 10 selectively attenuate an amplitude of at least some of the channels of the audio signal 20 based on a direction of the audio emergency warning signal 12 (box 510). In some embodiments the listening environment is the interior of a vehicle (box 515). This means that the audio signal 20 is playing within the vehicle.

The system 10 detects a direction relative to a source from which the audio emergency warning signal 12 is being emitted in order to obtain direction data 16 (box 520). In some embodiments a grid is used that has defined coordinates and is centered on the vehicle having the listening environment (box 525). The direction data 16 may include an angle relative to a reference line that is centered on the vehicle (box 530). This angle corresponds to a direction from where the audio emergency warning signal is being emitted.

The direction data 16 is processed to determine an amplitude of the audio emergency warning signal 12 as a function of direction (box 535). In this manner the audio emergency warning signal 12 can be localized and its direction determined. The system 10 selectively attenuates an amplitude of at least some channels of the audio signal 20 based on the amplitude of the audio emergency warning signal 12 as a function of direction (box 540).

Embodiments of the system 10 also analyze the direction data 16 to determine scale factors for scaling the amplitude of at least some channel of the audio signal 20 based on the direction relative to the source from where the audio emergency warning signal is be emitted (box 545). The scale factors are used to selectively attenuate the amplitude of at least some of the plurality of channels of the audio signal 20.

The audio emergency warning signal 12 is analyzed by the system 10 to obtain alarm frequency characteristics 18 (box 555). A filter is derived by using the alarm frequency characteristics 18 (box 560), and the audio signal 20 is filtered using the filter and the scale factors to selectively attenuate the alarm frequency in the audio signal 20 in at least some of the plurality of channels (box 565). In addition, some embodiments of the system 10 scale the amplitude of at least some of the channels such that those channels in a direction relative to the source from where the audio emergency warning signal 12 is emanating are scaled to a lower amplitude than other channels (box 570).

In some embodiments an overall power level 21 of the audio signal 20 is determined (box 575) and the amplitude of at least some channels is scaled based on the overall power level 21 and the scale factors 135 (box 580). In some embodiments of the system 10, any channels containing a vocal track are not attenuated (box 585). The output is the process audio signal as an amplitude-scaled multi-channel PCM audio signal (box 590).

There have been described systems techniques for detecting an external audio emergency warning signal in a listening environment when an audio signal is playing in the listening environment. Moreover, although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for processing an audio signal, comprising:
   selectively attenuating a specific frequency in the audio signal, the specific frequency corresponding to an alarm frequency of an audio emergency warning signal, so that an amplitude of the alarm frequency in the audio signal is attenuated relative to other frequencies in the audio signal;
   selectively attenuating the alarm frequency for each channel of the audio signal; and
   attenuating a low-frequency effects channel of the audio signal to allow a listener to hear the audio emergency warning signal.

2. The method of claim 1, further comprising removing the alarm frequency from the audio signal by attenuating the amplitude of the alarm frequency to zero in the audio signal.

3. The method of claim 1, further comprising selectively attenuating the alarm frequency for each channel of the audio signal.

4. A method for processing an audio signal, comprising:
   selectively attenuating a specific frequency in the audio signal, the specific frequency corresponding to an alarm frequency of an audio emergency warning signal, so that an amplitude of the alarm frequency in the audio signal is attenuated relative to other frequencies in the audio signal;
   selectively attenuating the alarm frequency for each channel of the audio signal; and
   attenuating front channels of the audio signal more than other channels of the audio signal to allow a listener to hear the audio emergency warning signal.

5. A method for processing an audio signal, comprising:
   analyzing an audio emergency warning signal to obtain alarm frequency characteristics;
   deriving a filter from the alarm frequency characteristics;
   filtering an alarm frequency of the audio emergency warning signal from the audio signal using the filter derived from the alarm frequency characteristics; and
   selectively attenuating the alarm frequency so that an amplitude of the alarm frequency in the audio signal is attenuated relative to other frequencies in the audio signal to allow a listener to hear the audio emergency warning signal.

6. A method for processing an audio signal, comprising:
   converting an audio emergency warning signal into a frequency domain;
   comparing alarm frequency characteristics of the audio emergency warning signal to a set threshold;
   computing a fundamental frequency of dominant peaks of the audio emergency warning signal that are above the set threshold, wherein the fundamental frequency corresponds to an alarm frequency of the audio emergency warning signal; and
   selectively attenuating the alarm frequency so that an amplitude of the alarm frequency in the audio signal is attenuated relative to other frequencies in the audio signal to allow a listener to hear the audio emergency warning signal.

7. A method for processing an audio signal having a plurality of channels in a vehicle, comprising:
   selectively attenuating an amplitude of at least some of the plurality of channels based on a direction of an audio emergency warning signal that is external to a listening environment of the audio signal;
   detecting a direction relative to the vehicle from which the audio emergency warning signal is being emitted to generate direction data;
   processing the direction data to determine an amplitude of the audio emergency warning signal as a function of direction; and
   selectively attenuating the amplitude of at least some of the plurality of channels based on the amplitude of the audio emergency warning signal as a function of direction.

8. A method for processing an audio signal having a plurality of channels in a vehicle, comprising:
   selectively attenuating an amplitude of at least some of the plurality of channels based on a direction of an audio emergency warning signal that is external to a listening environment of the audio signal;
   detecting a direction relative to the vehicle from which the audio emergency warning signal is being emitted to generate direction data;
   analyzing the direction data to determine scale factors for scaling the amplitude of at least some of the plurality of channels based on the direction relative to the vehicle from which the audio emergency warning signal is being emitted; and
   selectively attenuating the amplitude of at least some of the plurality of channels using the scale factors.

9. The method of claim 8, further comprising:
   analyzing the audio emergency warning signal to obtain alarm frequency characteristics;
   deriving a filter from the alarm frequency characteristics that filters an alarm frequency of the audio emergency warning signal from the audio signal; and
   filtering the audio signal using the filter and the scale factors to selectively attenuate the alarm frequency in the audio signal in at least some of the plurality of channels.

10. The method of claim 9, further comprising scaling the amplitude of at least some of the plurality of channels such that channels in the direction relative to the vehicle from which the audio emergency warning signal is being emitted are scaled to a lower amplitude than other channels.

11. A method for detecting an audio emergency warning signal in a vehicle in which an audio signal is being played back, comprising:
   determining an overall power level of the audio signal;
   determining an alarm frequency of the audio emergency warning signal that represents a fundamental frequency of the audio emergency warning signal;
   determining a direction relative to the vehicle from which the audio emergency warning signal is being emitted to obtain direction data, the audio emergency warning signal emanating from a source external to the vehicle;
   computing multi-channel attenuation coefficients from the overall power level, alarm frequency, and direction data; and
   selectively attenuating an amplitude of at least some of channels of the audio signal based on the multi-channel attenuation coefficients to detect the audio emergency warning signal from within the vehicle.

12. The method of claim 11, further comprising:
   generating a filter using the multi-channel attenuation coefficients; and
   filtering the audio signal using the filter to attenuate the alarm frequency in the audio signal.

13. The method of claim 12, further comprising:
  determining scale factors using the direction data; and
  scaling an amplitude of at least some of the channels of the audio signal using the scale factors.

14. The method of claim 11, further comprising playing the audio emergency warning signal through at least some of the plurality of channels based on the direction data such that the audio emergency warning signal is played through channels corresponding to the direction relative to the vehicle from which the audio emergency warning signal is being emitted.

15. The method of claim 11, further comprising playing audio cues through the plurality of channels to notify a listener of the audio emergency warning signal.

\* \* \* \* \*